United States Patent
Lin et al.

(10) Patent No.: US 9,419,786 B2
(45) Date of Patent: Aug. 16, 2016

(54) MULTI-LANE SERIAL LINK SIGNAL RECEIVING SYSTEM

(71) Applicant: MStar Semiconductor, Inc., Hsinchu Hsein (TW)

(72) Inventors: Po-Nien Lin, Zhubei (TW); Meng-Tse Weng, Zhubei (TW); Jiunn-Yih Lee, Zhubei (TW)

(73) Assignee: MStar Semiconductor, Inc., Hsinchu Hsien (TW)

( * ) Notice: Subject to any disclaimer, the term of this patent is extended or adjusted under 35 U.S.C. 154(b) by 0 days.

(21) Appl. No.: 14/670,499

(22) Filed: Mar. 27, 2015

(65) Prior Publication Data
US 2015/0280761 A1  Oct. 1, 2015

(30) Foreign Application Priority Data
Mar. 28, 2014  (TW) .............................. 103111747 A

(51) Int. Cl.
| H04L 7/033 | (2006.01) |
| H03L 7/08 | (2006.01) |
| H03L 7/081 | (2006.01) |

(52) U.S. Cl.
CPC ................ *H04L 7/033* (2013.01); *H03L 7/081* (2013.01); *H03L 7/0807* (2013.01); *H04L 7/0337* (2013.01)

(58) Field of Classification Search
CPC ......... H04L 7/02; H04L 7/0016; H04L 7/005; H04L 7/0033; H04L 7/033; H04L 2027/0069; H04L 7/0331; H04L 29/00; H04L 27/1566; H04L 27/2272; H03L 7/087
USPC .......... 375/294, 316, 326–327, 355, 371–376
See application file for complete search history.

(56) References Cited

U.S. PATENT DOCUMENTS

| 7,099,582 | B2 * | 8/2006 | Belhadj-Yahya | ....... | H04J 14/02 370/333 |
| 7,308,058 | B2 * | 12/2007 | Zerbe | ................ | H04L 1/0003 375/259 |
| 7,467,335 | B2 * | 12/2008 | Otto | ................ | H04L 25/14 714/700 |
| 7,474,612 | B1 * | 1/2009 | Patel | ................ | H04J 3/062 370/217 |
| 7,656,323 | B2 * | 2/2010 | Bereza | ................ | H03K 5/15026 341/100 |
| 7,684,534 | B2 * | 3/2010 | Buchmann | ........ | G06F 13/4291 375/316 |
| 7,746,969 | B2 * | 6/2010 | Bryan | ................ | H04L 25/03878 375/219 |
| 7,760,116 | B2 * | 7/2010 | Liu | ................ | H03L 7/0812 341/100 |
| 7,830,986 | B1 * | 11/2010 | Gaither | ................ | H03L 7/085 327/147 |

(Continued)

OTHER PUBLICATIONS

TIPO Office Action, Dec. 22, 2015, 4 pages.

*Primary Examiner* — Emmanuel Bayard
(74) *Attorney, Agent, or Firm* — Edell, Shapiro & Finnan, LLC

(57) ABSTRACT

A multi-lane serial link signal receiving system includes a clock generating circuit and a plurality of data receiving channels. The clock generating circuit provides a fundamental clock signal. Each of the data receiving channels receives an input signal and the fundamental clock signal, and includes a phase detecting circuit, a multi-order digital clock data recovery circuit and a phase adjusting circuit. The phase detecting circuit samples the input signal according to a sampling clock signal to generate a sampled signal. The multi-order digital clock data recovery circuit performs a digital clock data recovery process on the sampled signal to generate phase adjusting information. The phase adjusting circuit adjusts the phase of the fundamental clock signal according to the phase adjusting information to generate the sampling clock signal.

9 Claims, 5 Drawing Sheets

(56) References Cited

U.S. PATENT DOCUMENTS

| | | | | |
|---|---|---|---|---|
| 7,860,400 B2* | 12/2010 | Cole | H03M 9/00 | 398/154 |
| 7,913,104 B1* | 3/2011 | Cory | G06F 1/10 | 713/400 |
| 7,924,186 B2* | 4/2011 | Diab | H04L 7/0004 | 341/100 |
| 7,978,802 B1* | 7/2011 | Raha | H03L 7/07 | 375/371 |
| 8,027,114 B1* | 9/2011 | Han | G11B 5/09 | 360/39 |
| 8,085,173 B2* | 12/2011 | Diab | H04J 3/0685 | 341/100 |
| 8,126,401 B2* | 2/2012 | Staszewski | H03L 7/085 | 375/376 |
| 8,130,891 B2* | 3/2012 | Kim | H03L 7/0814 | 375/375 |
| 8,149,979 B2* | 4/2012 | Buchmann | G06F 13/4291 | 375/316 |
| 8,179,984 B2* | 5/2012 | Luo | G09G 3/2096 | 348/423.1 |
| 8,405,434 B2* | 3/2013 | Jakobsson | H03L 7/087 | 327/147 |
| 8,410,834 B2* | 4/2013 | Lin | H04L 7/0079 | 327/114 |
| 8,502,581 B1 | 8/2013 | Opris | | |
| 8,575,935 B2* | 11/2013 | Roeven | G01R 33/3621 | 324/322 |
| 8,804,888 B2* | 8/2014 | Mohajeri | H03L 7/06 | 375/294 |
| 8,873,606 B2* | 10/2014 | Zhang | H03D 3/006 | 375/219 |
| 8,941,424 B2* | 1/2015 | Jin | H03L 7/093 | 327/149 |
| 8,995,514 B1* | 3/2015 | Asuncion | H04B 3/46 | 375/226 |
| 9,036,764 B1* | 5/2015 | Hossain | H04L 7/0331 | 375/355 |
| 9,048,999 B2* | 6/2015 | He | H04L 7/0062 | |
| 2002/0075981 A1* | 6/2002 | Tang | H04J 3/047 | 375/372 |
| 2006/0083343 A1* | 4/2006 | Roederer | H04L 7/033 | 375/375 |
| 2011/0216863 A1* | 9/2011 | Tomita | H04L 7/00 | 375/371 |
| 2011/0267122 A1* | 11/2011 | Jeong | H03L 7/0807 | 327/165 |
| 2013/0285720 A1* | 10/2013 | Jibry | H03L 7/06 | 327/156 |
| 2015/0010044 A1* | 1/2015 | Zhang | H03D 3/006 | 375/219 |
| 2015/0043616 A1* | 2/2015 | Vigraham | H04B 1/16 | 375/130 |
| 2015/0103961 A1* | 4/2015 | Malipatil | H04L 7/0016 | 375/355 |
| 2015/0162922 A1* | 6/2015 | Song | H04L 7/0091 | 375/376 |
| 2015/0180760 A1* | 6/2015 | Rickard | H04L 43/50 | 370/252 |
| 2015/0222287 A1* | 8/2015 | Tekin | H03M 1/0836 | 375/355 |

* cited by examiner

MULTI-LANE SERIAL LINK SIGNAL
RECEIVING SYSTEM

This application claims the benefit of Taiwan application Serial No. 103111747, filed Mar. 28, 2014, the subject matter of which is incorporated herein by reference.

BACKGROUND OF THE INVENTION

1. Field of the Invention

The invention relates in general to a signal receiving interface, and more particularly to a circuit structure of a multi-lane serial link signal receiving interface.

2. Description of the Related Art

With the constant progress of electronic technologies, display apparatuses of all diversities are becoming more and more popular. Various kinds of electronic devices, such as television systems, computer systems, projectors, digital cameras, disk players, mobile phones and game consoles, all need a high data rate and quality video/audio transmission interface. DisplayPort (DP) is one of the latest multimedia receiving interfaces.

FIG. 1 shows a front-end function block of a DP receiving circuit. As shown in FIG. 1, four pairs of differential image data signals Data#0, Data#1, Data#2 and Data#3 are inputted into a DP receiver, and are respectively provided to analog front-end circuits 110A to 110D. Signals having been preliminarily processed by the analog front-end circuits 110A to 110D are respectively provided to analog clock data recovery (ACDR) circuits 120A to 120D for clock data recovery, and then to demultiplexers 130A to 130D for demultiplexing.

In addition to the DP interface, there are several types of multi-lane serial link signal receiving interfaces, e.g., Serial Advanced Technology Attachment (SATA) and Peripheral Component Interconnect Express (PCIE), which also adopt the circuit structure similar to that in FIG. 1. Known to one person skilled in the art, as an ACDR circuit has a large chip area and high power, an overall size and power consumption of such signal receiving system are correspondingly increased.

SUMMARY OF THE INVENTION

The invention is directed to a multi-lane serial link signal receiving system that replaces an analog clock data recovery (ACDR) circuit using a multi-order digital clock data recovery (DCDR) circuit capable of simultaneously tracking frequency and phase. It should be noted that, the concept of the present invention is applicable to various kinds of multi-lane serial link signal receiving systems and is not limited to applications of a DP interface.

According to an embodiment of the present invention, a signal receiving system is provided. The signal receiving circuit includes a clock generating circuit and a plurality of data receiving channels. The clock generating circuit provides a fundamental clock signal. Each of the data receiving channels receives an input signal and the fundamental clock signal, and includes a phase detecting circuit, a multi-order digital clock data recovery (DCDR) circuit and a phase adjusting circuit. The phase detecting circuit samples the input signal according to a sampling clock signal to generate a sampled signal. The multi-order DCDR circuit performs a DCDR process on the sampled signal to generate phase adjusting information. The phase adjusting circuit receives the phase adjusting information and the fundamental clock signal, and adjusts the phase of the fundamental clock signal according to the phase adjusting information to generate the sampling clock signal for the phase detecting circuit.

According to another embodiment of the present invention, a signal receiving system is provided. The signal receiving system includes a clock generating circuit and a plurality of data receiving channels. The clock generating circuit generates a fundamental clock signal. Each of the data receiving channels receives an input signal and the fundamental clock signal. Each of the data receiving channels includes: a phase detecting circuit, configured to sample the input signal according to a sampling clock signal to generate a sampled signal; a two-order DCDR circuit, including a proportional circuit configured to perform a scaling process on the sampled signal to generate a phase error signal, an integral circuit configured to perform an integration process on the sampled signal to generate a frequency error signal, an adder configured to add the frequency error signal and the phase error signal to generate a total error signal, and a phase adjusting information generating circuit configured to determine phase adjusting information according to the total error signal; and a phase adjusting circuit, configured to receive the phase adjusting information and the fundamental signal, and to adjust the phase of the fundamental clock signal according to the phase adjusting information to generate the sampling clock signal for the phase detecting circuit.

The above and other aspects of the invention will become better understood with regard to the following detailed description of the preferred but non-limiting embodiments. The following description is made with reference to the accompanying drawings.

DETAILED DESCRIPTION OF THE INVENTION

Figure 2:
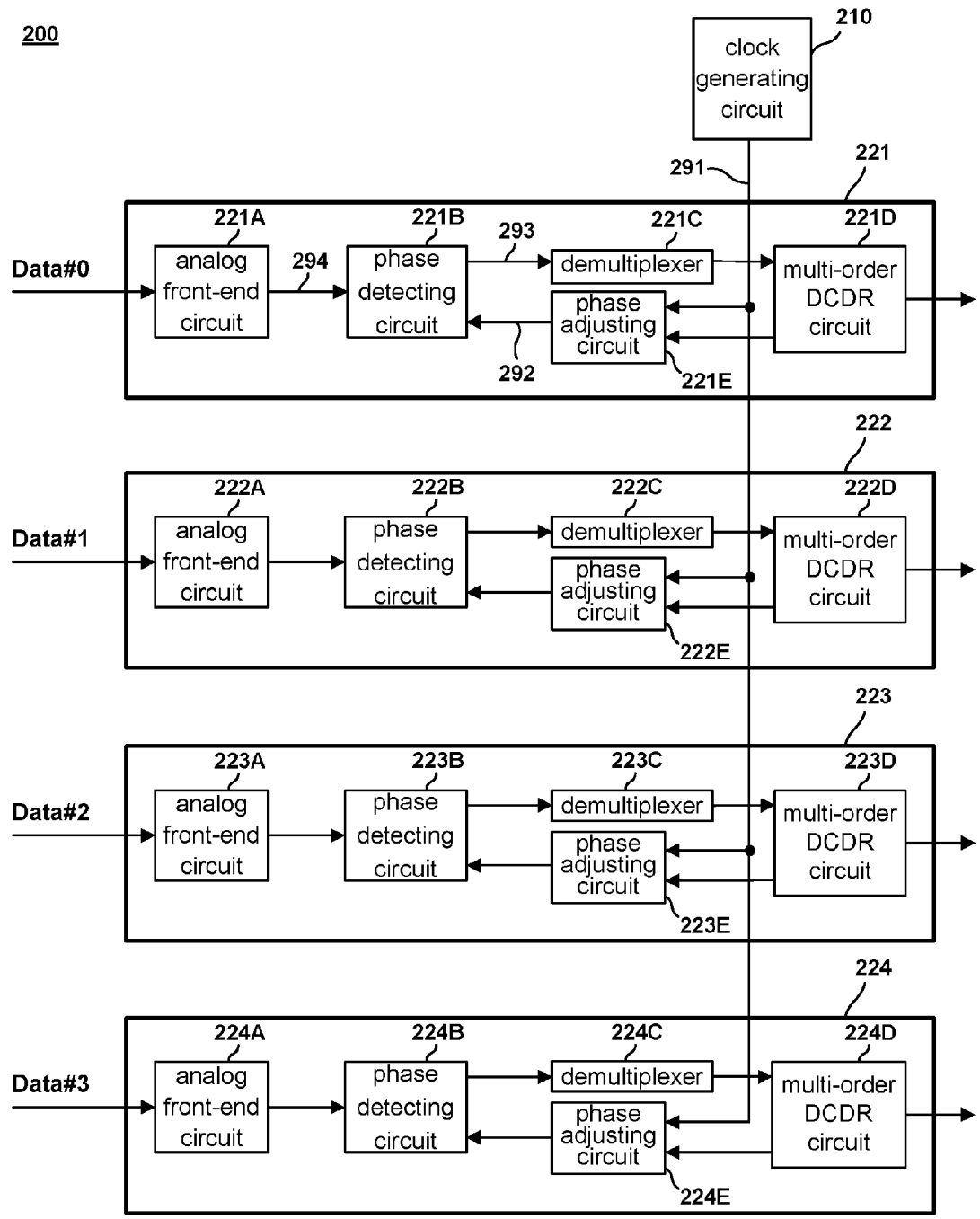
FIG. 2 is a function block of a multi-lane serial link signal receiving system according to an embodiment of the present invention.

FIG. 2 shows a function block diagram of a multi-lane serial link signal receiving system according to an embodiment of the present invention. In practice, the multi-lane serial link signal receiving system 200 may be integrated into various kinds of electronic devices such as televisions, computer monitors and projectors, or may be an independent unit. In the description below, specifications of a DisplayPort (DP) interface are taken as an example. One person skilled in the art can understand that, the concept of the present invention is applicable to various kinds of multi-lane serial link signal receiving systems and is not limited to applications of a DP interface.

As shown in FIG. 2, the multi-lane serial link signal receiving system 200 includes a clock generating circuit 210 and a plurality of data receiving channels 221 to 224. It should be noted that, the number of the data receiving channels in FIG. 2 is four as an example for explaining the present invention, and is not to be construed as a limitation to the present invention. The clock generating circuit 210 provides a fundamental clock signal 291. In practice, the fundamental signal 291 may be a square wave signal having a fixed frequency, which may be set to equal to or approximately equal to a sampling frequency, i.e., the frequency of input signals into the data receiving channels 221 to 224. For example, the clock generating circuit 210 may include a phase locked loop (PLL) and a local oscillation signal generator. The oscillation signal generated by the local oscillation signal generator is provided to the PLL to serve as an input signal into a phase frequency detector in the PLL, and is frequency multiplied and locked by the PLL.

The data receiving channels 221 to 224 include analog front-end circuits 221A to 224A, phase detecting circuits 221B to 224B, demultiplexers 221C to 224C, multi-order digital clock data recovery (DCDR) circuits 221D to 224D, and phase adjusting circuits 221E to 224E, respectively. If the multi-lane serial link signal receiving system 200 is a DP receiving circuit, four pairs of differential signals Data#0, Data#1, Data#2 and Data#3 are respectively inputted to the analog front-end circuits 221A to 224A. Each of the phase detecting circuits 221B to 224B includes a sampling circuit and a phase determining circuit (not shown). Taking the data receiving channel 221 for example, the phase detecting circuit 221B samples an input signal 294 according to a sampling clock signal 292 provided by the phase adjusting circuit 221E to generate a sampled signal 293. Via the demultiplexer 221C, the sampled signal 293 is demultiplexed and transmitted to the multi-order DCDR circuit 221D.

Next, the multi-order DCDR circuit 221D applies a DCDR process on the sampled signal 293 to generate phase adjusting information. More specifically, the multi-order DCDR circuit 221D determines whether the current sampling clock signal 292 is ahead or behind to accordingly determine how to adjust the phase of the sampling clock signal 292 in order to enhance the quality of the sampled signal 293. The phase adjusting circuit 221E receives the phase adjusting information and the fundamental clock signal 291, and adjusts the phase of the fundamental clock signal 291 according to the phase adjusting information to generate the sampling clock signal 292 for the phase detecting circuit 221B. It should be noted that, operation details of the phase adjusting circuit 221B are generally known to one person skilled in the art, and shall be omitted herein.

Figure 1:
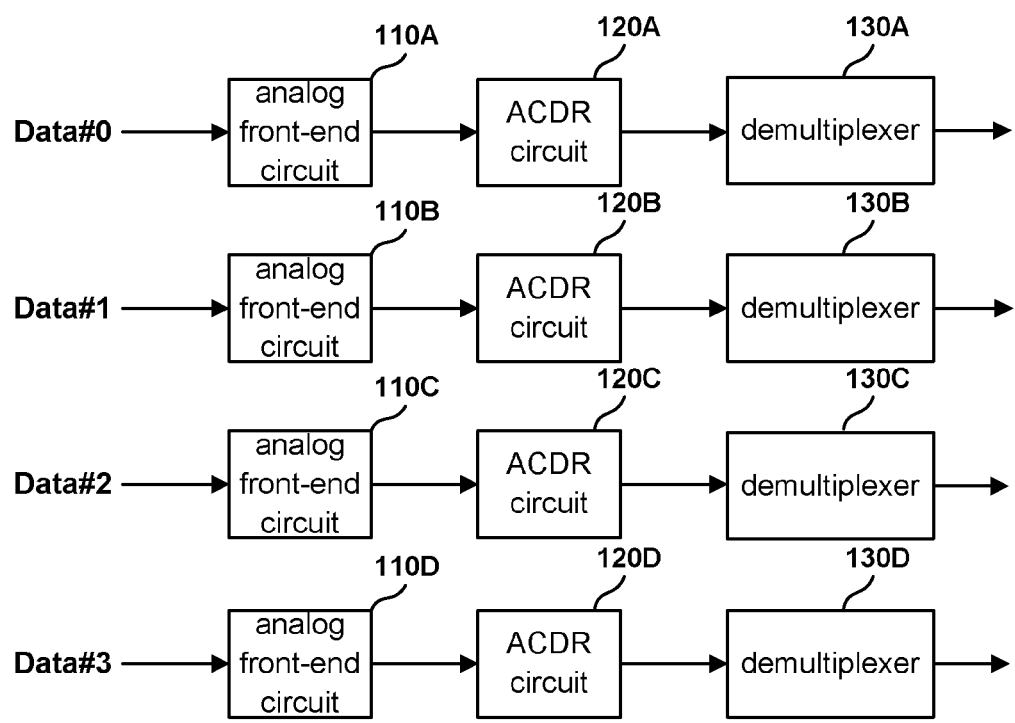
FIG. 1 is a front-end function block of a DisplayPort (DP) circuit.
Figure 3:
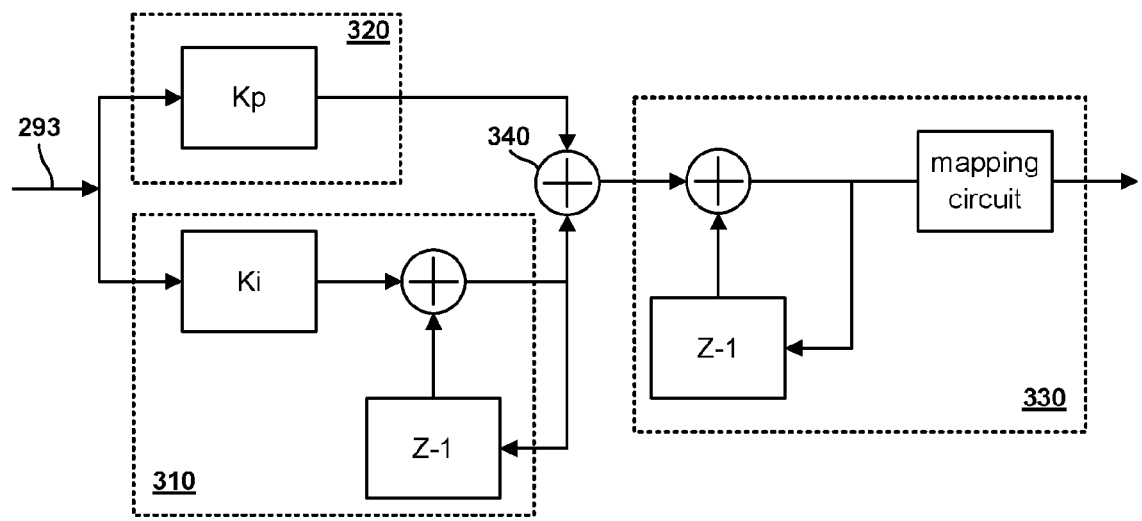
FIG. 3 is an example of a two-order digital clock data recovery (DCDR) circuit according to an embodiment of the present invention.

In one embodiment, each of the multi-order DCDR circuits 221D to 224D is a two-order DCDR circuit shown in FIG. 3. The two-order DCDR circuit in the embodiment includes an integral circuit 310, a proportional circuit 320, a phase adjusting information generating circuit 330 and an adder 340. The sampled signal 293 that the two-order DCDR circuit receives concurrently includes a phase component and a frequency component. The integral circuit 310 tracks the frequency of the signal to eliminate a frequency error. More specifically, the integral circuit 310 performs an integration process on the sampled signal 293 to convert the frequency component to the phase component to generate a frequency error signal. The proportional circuit 320 performs a scaling process on the sampled signal 293 to generate a phase error signal. The adder 340 adds the frequency error signal and the phase error signal to generate a total error signal, such that the phase component of the total error signal includes the frequency error. The phase adjusting information generating circuit 330 then determines the phase adjusting information according to the total error signal. It should be noted that, in the embodiment of the present invention, the multi-order DCDR circuits 221D to 224D are not limited to being two orders, nor are limited to implementation details shown in FIG. 3. Further, the multi-order DCDR circuits 221D to 224D need not have the same number of orders. Different from a single-order DCDR circuit capable of tracking only the phase of a signal, a multi-order DCDR circuit is capable of simultaneously tracking the frequency and the phase of a signal. Thus, in addition to solving the issue of being capable of providing only phase correcting information of a conventional one-order DCDR circuit but not a frequency correcting function, the multi-order DCDR circuit also yields a result closer to that of an ACDR circuit. In practice, the multi-lane serial link signal receiving system 200 is capable of providing the function of the DP receiving circuit in FIG. 1. Compared to an ACDR circuit, a multi-order DCDR circuit features advantages of a smaller chip size as well as a lower power consumption.

It should be noted that, the multi-order DCDR circuits 221D to 224D have characteristics of tracking the frequency of a signal. Therefore, even when the frequencies of the signals Data#0, Data#1, Data#2 and Data#3 may be different, given that the phase adjusting circuits 221E to 224E share the same fundamental clock signal 291 generated by the clock generating circuit 210, the data receiving channels 221 to 224 can still complete respective clock data recovery processes without involving four individual sets of clock generating circuits. In other words, the multi-lane serial link signal receiving system 200 may be implemented in an application of multiple input signals having different frequencies.

Figure 4:
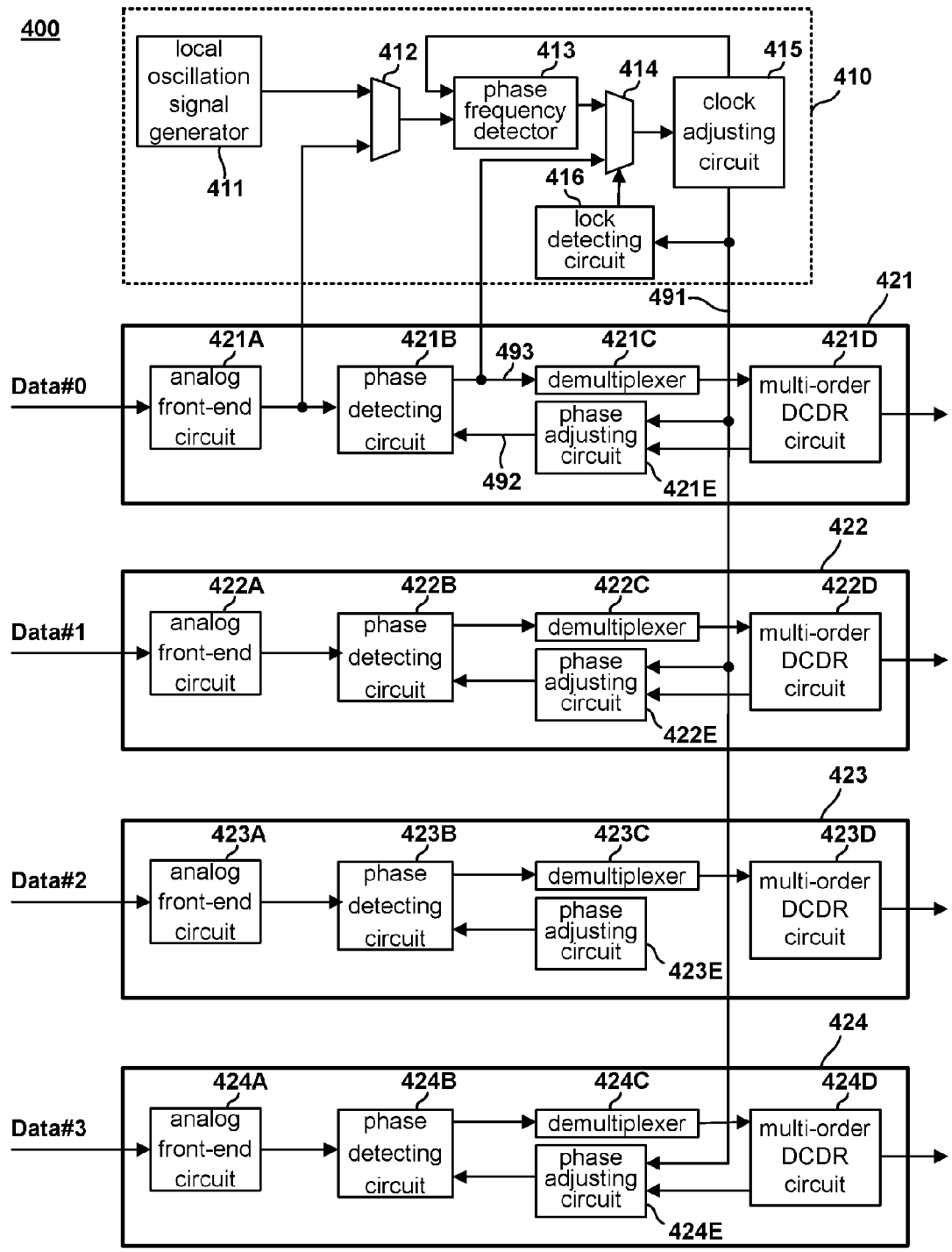
FIG. 4 is a function block of a multi-lane serial link signal receiving system according to another embodiment of the present invention.
Figure 5:
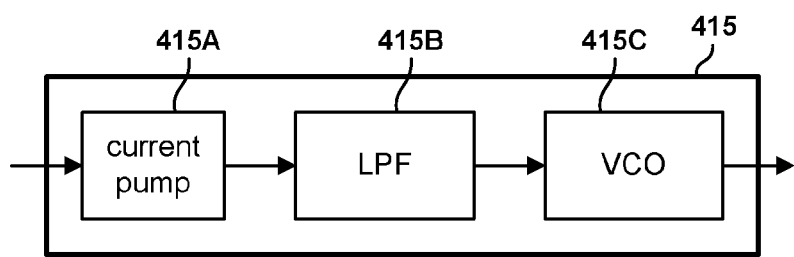
FIG. 5 is a detailed example of a clock adjusting circuit according to the present invention.

FIG. 4 shows a function block diagram of a multi-lane serial link signal receiving system according to another embodiment of the present invention. A multi-lane serial link signal receiving system 400 includes a clock generating circuit 410 and a plurality of data receiving channels 421 to 424. In the embodiment, the clock generating circuit 410 includes a local oscillation signal generator 411, a multiplexer 412, a phase frequency detector 413, a multiplexer 414, a clock adjusting circuit 415 and a lock detecting circuit 416. FIG. 5 shows a detailed example of the clock adjusting circuit 415. In the example, the clock adjusting circuit 415 includes a current pump 415A, a low-pass filter (LPF) 415B and a voltage-controlled oscillator (VCO) 415C.

When the multi-lane serial link signal receiving system 400 is in a first mode, the multiplexer 412 is switched to connect to an output end of the local oscillation signal generator 411 and an input end of the phase frequency detector 413, and the multiplexer 414 is switched to connect to an output end of the phase frequency detector 413 and an input end of the clock adjusting circuit 415. Under the above conditions, an output end of the VCO 415C is fed back to the other input end of phase frequency detector 413, such that the phase frequency detector 413, the current pump 415A, the LPF 415B and the VCO 415C form a phase locked loop (PLL), and an oscillation signal outputted by the local oscillation signal generator 411 becomes locked, i.e., a fundamental clock signal 491 is generated according to the oscillation signal. Comparing FIG. 4 with FIG. 2, the multi-lane serial link signal receiving system 400 in the first mode is equivalent to the multi-lane serial link signal receiving system 200 in FIG. 2.

When the multi-lane serial link signal receiving system 400 is in a second mode, the local oscillation signal generator 411 and a phase adjusting circuit 421E are suspended, and the multiplexer 412 is switched to connect to an output end of an analog front-end circuit 421A and an output end of the phase frequency detector 413. Further, each of the multi-order DCDR circuits 422D to 424D is reconfigured to a single-order DCDR circuit (e.g., which may be equivalently achieved by suspending the proportional circuit 310 or the integral circuit 320 in FIG. 3). In the second mode, the multiplexer 414 is first switched to connect to the output end of the phase frequency detecting circuit 413 and the input end of the clock adjusting circuit 415. According to DP specifications, the four pairs of differential image data signals are clock signals during an initial period. In other words, the output signal of the analog front-end signal 421A is a clock signal during an initial period. As such, the output end of the VCO 415C is fed back to the other input end of the phase frequency detector 413, such that the phase frequency detector 413 and the clock adjusting circuit 415 form a PLL and the clock signal outputted from the analog front-end circuit 421A also becomes locked.

Once the lock detecting circuit 416 determines that the PLL satisfies a locking condition (e.g., when the output frequency falls in a predetermined range), the lock detecting circuit 416 switches the multiplexer 414 to connect to the output end of the phase detecting circuit 421B and the clock adjusting circuit 415 such that the phase detecting circuit 421B, the current pump 415A, the LPF 415B and the VCO 415C form an ACDR circuit to generate the fundamental clock signal 491. It should be noted that, the suspended phase adjusting circuit 421E transmits the fundamental clock signal 491 to the phase detecting circuit 421B as the sampling clock signal 492, and the output signal 493 from the phase detecting circuit 421B is demultiplexed by the demultiplexer 421C and transmitted to a rear-end circuit. In the second mode, the phase frequency detector 413 that does not take effect may be suspended. The above ACDR circuit is equivalent to the ACDR circuit 130A in FIG. 1.

As shown in FIG. 4, the fundamental clock signal 491 is also provided to the remaining phase adjusting circuits 422E to 424E to generate sampling clock signals. According to the adjusting information provided by the DCDR circuits 422D to 424D, the phase adjusting circuits 422E to 424E adjust the phases of the respective fundamental clock signals 491 to generate respective sampling clock signals. In a DP configuration, the purposes of the DCDR circuits 430B to 430D are to replace the ACDR circuits 320B to 320D in FIG. 3. Comparing FIG. 1 with FIG. 4, it is observed that, by adopting the above signal connection configuration, the multi-lane serial link signal receiving system 400 is equivalent to the DP receiving circuit in FIG. 1, with an only difference being that the ACDR is replaced by the DCDR in the three latter signal processing channels.

The second mode of the multi-lane serial link signal receiving system 400 is suitable in an application where the frequencies of the signals Data#0, Data#1, Data#2 and Data#3 are substantially the same. In the above conditions, the DCDR circuits 422D to 424D that are switched to one-order DCDR circuits are required to provide a function of tracking only the phase of a signal.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A multi-lane serial link signal receiving system, comprising:
    a clock generating circuit, configured to provide a fundamental clock signal; and
    a plurality of data receiving channels, each receiving an input signal and the fundamental clock signal, each comprising:
        a phase detecting circuit, configured to sample the input signal according to a sampling clock signal to generate a sampled signal;
        a multi-order digital clock data recovery (DCDR) circuit, configured to perform a DCDR process on the sampled signal to generate phase adjusting information; and
        a phase adjusting circuit, configured to receive the phase adjusting information and the fundamental signal, and to adjust a phase of the fundamental signal according to the phase adjusting information to generate the sampling clock signal for the phase detecting circuit,
    wherein the clock generating circuit generates the fundamental clock signal according to the local oscillation signal when the multi-lane serial link signal receiving system is operated in a first mode and the fundamental clock signal according to the input signal when the multi-lane serial link signal receiving system is operated in a second mode.

2. The multi-lane serial link signal receiving system according to claim 1, wherein the multi-order DCDR circuit is a two-order DCDR circuit.

3. The multi-lane serial link signal receiving system according to claim 1, wherein the clock generating circuit comprises a phase locked loop (PLL) and a local oscillation signal generator.

4. The multi-lane serial link signal receiving system according to claim 3, wherein the PLL comprises a phase frequency detector; when the multi-lane serial link signal receiving system is operated in a first mode, the phase frequency detector receives a local oscillation signal generated by the local oscillation signal generator, and the PLL generates the fundamental clock signal according to the local oscillation signal.

5. The multi-lane serial link signal receiving system according to claim 4, wherein the PLL comprises a phase frequency detector; when the multi-lane serial link signal receiving system is operated in a second mode, the local oscillation signal generator is suspended, the multi-order DCDR circuit of a predetermined data receiving channel of the plurality of data receiving channels is suspended, and each of the remaining multi-order DCDR circuits is reconfigured as a single-order DCDR circuit.

6. A multi-lane serial link signal receiving system, comprising:
    a clock generating circuit, configured to provide a fundamental clock signal; and
    a plurality of data receiving channels, each receiving an input signal and the fundamental clock signal, each comprising:
        a phase detecting circuit, configured to sample the input signal according to a sampling clock signal to generate a sampled signal;
        a two-order digital clock data recovery (DCDR) circuit, comprising:
            a proportional circuit, configured to perform a scaling process on the sampled signal to generate a phase error signal;
            an integral circuit, configured to perform an integration process on the sampled signal to generate a frequency error signal;
            an adder, configured to add the frequency error signal and the phase error signal to generate a total error signal; and a phase adjusting information generating circuit, configured to determine phase adjusting information according to the total error signal; and a phase adjusting circuit, configured to receive the phase adjusting information and the fundamental clock signal, and to adjust a phase of the fundamental clock signal according to the phase adjusting information to generate the sampling clock signal for the phase detecting circuit, wherein the clock generating circuit generates the fundamental clock signal according to the local oscillation signal when the multi-lane serial link signal receiving system is operated in a first mode and the fundamental clock signal according to the input signal when the multi-lane serial link signal receiving system is operated in a second mode.

7. The multi-lane serial link signal receiving system according to claim 6, wherein the clock generating circuit further comprises a PLL and a local oscillation signal generator.

8. The multi-lane serial link signal receiving system according to claim 7, wherein the PLL comprises a phase frequency detector; when the multi-lane serial link signal receiving signal system is operated in a first mode, the phase frequency detector receives a local oscillation signal generated by the local oscillation signal generator, and the PLL generates the fundamental clock signal according to the local oscillation signal.

9. The multi-lane serial link signal receiving system according to claim 8, wherein the PLL comprises a phase frequency detector; when the multi-lane serial link signal receiving system is operated in a second mode, the local oscillation signal generator is suspended, and one of the proportional circuit and the integral circuit of the two-order DCDR circuit in the plurality of data receiving channels is suspended.

\* \* \* \* \*